United States Patent [19]
Danyluk et al.

[11] Patent Number: 5,661,113
[45] Date of Patent: Aug. 26, 1997

[54] NEAR NET SHAPE PROCESSING OF CONTINUOUS LENGTHS OF SUPERCONDUCTING WIRE

[75] Inventors: Steven Danyluk, Atlanta, Ga.; Michael McNallan, Oak Park, Ill.; Robert Troendly, St. Charles, Ill.; Roger Poeppel, Glen Ellyn, Ill.; Kenneth Goretta, Downer Grove, Ill.; Michael Lanagan, Woodridge, Ill.

[73] Assignee: University of Chicago, Chicago, Ill.

[21] Appl. No.: 317,353

[22] Filed: Oct. 4, 1994

[51] Int. Cl.$^6$ .................................................. H01L 39/24
[52] U.S. Cl. ........................ 425/335; 53/527; 228/158; 425/374; 425/412; 505/239; 505/433; 505/236; 505/950
[58] Field of Search ..................... 29/599; 505/430, 505/432, 433, 230, 326, 237, 239; 53/527; 228/158; 425/335, 374, 412; 264/60, 61

[56] References Cited

U.S. PATENT DOCUMENTS

| | | | |
|---|---|---|---|
| 332,406 | 12/1885 | Libby | 228/158 |
| 2,416,400 | 2/1947 | Mehl | 228/158 X |
| 3,001,343 | 9/1961 | Gordon et al. | 53/527 X |
| 4,333,228 | 6/1982 | Koch | 29/599 |
| 4,411,122 | 10/1983 | Cornish et al. | 53/527 X |
| 4,804,550 | 2/1989 | Bardsley et al. | 53/527 X |
| 4,906,609 | 3/1990 | Yamauchi et al. | |
| 4,980,964 | 1/1991 | Boeke | |
| 5,043,320 | 8/1991 | Meyer et al. | |
| 5,075,286 | 12/1991 | Powell et al. | 29/599 X |
| 5,206,211 | 4/1993 | Meyer | |
| 5,432,150 | 7/1995 | Zhou | 29/599 X |
| 5,462,920 | 10/1995 | Mukai et al. | 505/433 X |

FOREIGN PATENT DOCUMENTS

| | | | |
|---|---|---|---|
| 5217438 | 8/1993 | Japan | 503/430 |

OTHER PUBLICATIONS

"Development of Elements of a High Tc Superconducting Cable," Lay, Final Report—Contract Period Sep. 1, 1988–Dec. 31, 1992, DARPA/ONR Contract No. N00014-88-C-0681, An Alternate Forming Process, pp. 8-1 to 8-3.

"High Critical Current Silver—$Bi_2Sr_2CaCu_2O_{8-x}$ Superconducting Multilayer Ribbons Produced By Rolling," Whitlow, et al., Preprint to be published in Proceedings of Conference on Superconductivity and Applications, Sep. 1992.

"Thermomechanical Processing of $YBa_2Cu_3O_x$/Ag Sheathed Wires," McGuire, et al., Superconductivity II, Reprinted from Ceramic Transactions, vol. 18, 1991, p. 453–460.

"Ceramic Superconductors II, Texturing of $RBa_2Cu_3O_x$ Superconductors," Goretta, et al., Research Update, 1988, pp. 323–331.

"High–Temperature Superconductivity: Four Years Since Bednorz and Müller, Grant, Advanced Materials", 1990, pp. 232–253.

"Shape Forming High–Tc Superconductors," Poeppel, et al., JOM, Jan. 1989, pp. 11–13.

"Critical Issues in the OPIT Processing of High–Jc BSCCO Superconductors," Sandhage, et al., JOM, Mar. 1991, pp. 21–25.

"Processing and Fabrication Techniques for Bulk High–Tc Superconductors: A Critical Review," Jin, et al., Materials Science and Engineering, B7(1991) 243–260.

(List continued on next page.)

*Primary Examiner*—Joseph M. Gorski
*Attorney, Agent, or Firm*—Reinhart, Boerner, Van Deuren, Norris & Rieselbach, s.c.

[57] ABSTRACT

A system and method for mechanically forming a ceramic superconductor product. A system for making the ceramic superconductor includes a metallic channel portion having a cross section for receiving a ceramic superconductor powder, a roll to mechanically reduce the channel cross section and included superconductor powder and a cap portion welded to the channel portion using a localized high energy source. The assembled bar is then mechanically reduced to form a tape or wire end product.

13 Claims, 6 Drawing Sheets

OTHER PUBLICATIONS

"The New Superconductors: Prospects for Applications," Wolsky, et al., Scientific American, Feb. 1989, pp. 60–69.

"Critical Issues in the OPIT Processing of High-$J_c$ BSCCO Superconductors," Sandhage, et al., JOM, Mar. 1991, pp. 21–25.

"Important Considerations for Processing Bi–Based High-Temperature Superconducting Tapes and Films for Bulk Applications," Hellstrom, MRS Bulletin, Aug. 1992, vol. 17, No. 8 pp. 45–51.

"Effects of Processing Parameters on Critical Current Density of Ag–CLAD $Bi_2Sr_2CaCu_2O_x$ Tapes," Wu, et al., Applied Superconductivity vol. 1, No. 1/2, pp. 33–42, 1993.

"A Model for the Critical Current in $(Bi,Pb)_2Sr_2Ca_2Cu_3O_x$ Silver–Sheathed Tapes," Hensel, et al., Physica C 205 (1993) pp. 329–337.

"Transport Critical Currents in Spray Pyrolyzed Films of $TlBa_2Ca_2Cu_3O_z$ on Polycrystalline Zirconia Substrates," Tkaczyk, et al., Applied Physics Letter 62 (5) 3 Aug. 1992 pp. 610–612.

"The Preparation of 1223 Tl–Ca–Ba–Cu–oxide Superconducting Films via the Reaction of Silver–Containing Spray Deposited Ca–Ba–Cu–oxide with Thallium Oxide Vapor," DeLuca, et al, Physica C 205 (1993) pp. 21–31.

"Single–crystal $YBa2Cu3O_{7-x}$ and $Bi2Ca_{1+x}Cu2O_{8+y}$ surfaces and Ag adatom–induced modification," Heyer et al, Journal Appl. Phys. 65(8), 15 Apr. 1989, pp. 3130–3135.

5,661,113

NEAR NET SHAPE PROCESSING OF CONTINUOUS LENGTHS OF SUPERCONDUCTING WIRE

The United States Government has rights in this invention pursuant to Contract No. W-31-109-ENG-38 between the United States Department of Energy and The University of Chicago, representing Argonne National Laboratory.

The present invention is concerned generally with an improved method of manufacturing ceramic superconductor tape. More particularly, the invention is concerned with a method of rolling a ceramic superconductor to continuously manufacture a clad ceramic superconductor tape. The rolling operation uses a closed metal channel shaped to hold the ceramic powder and the rolling proceeds by use of a roll head with a shape complementary to the metal channel shape.

A class of ceramic materials have been discovered which have superconducting properties above the boiling point of liquid nitrogen. Ceramic superconductors can be produced by a number of conventional ceramic processing techniques, but effective commercial utilization of these ceramic superconductors will require substantial improvement of the product materials. For example, the ceramic superconductors would be very useful if they could be manufactured in large rolls of tape or wire. However, the extremely brittle mechanical properties make the manufacture of such products difficult. In addition such ceramics conduct electricity preferentially along selected crystallographic planes; thus, it is desirable to produce textured materials with the selected planes oriented optimally for best electrical performances. However, such textured materials are not easily produced using conventional ceramic forming techniques.

Powder in tube techniques have been developed for the high temperature superconductors wherein a metallic non-superconducting tube is muzzle loaded with a superconducting ceramic powder. The filled tube is extruded or drawn or swaged to small cross-sections, and the reduced size rod is drawn or rolled into wire or tape. The reduced wire or tape is then sintered to densify the powder and establish the superconducting properties. Attempts have been made to enhance the crystallographic texture of the reduced wire or tape; but substantial limitations have been encountered, such as being limited to the manufacture of fixed lengths of wire or tape due to the batch nature of the process (loading powder into a fixed length tube or channel and processing that piece). In addition, defects (such as cracks) can be generated by these conventional thermal and mechanical processing techniques.

It is therefore an object of the invention to provide an improved method of mechanically manufacturing a high temperature ceramic superconductor.

It is another object of the invention to provide a novel method of continuously manufacturing a length of wire or tape of ceramic superconductor.

It is also an object of the invention to provide an improved method of making a continuous length of ceramic superconductor using a rolling channel and matingly shaped roll to reduce the superconductor cross-section.

It is a further object of the invention to provide a novel apparatus for rolling a ceramic superconductor by forming a channel having the same general shape as the final product which enables generating a product with more uniform stress.

It is yet another object of the invention to provide an improved apparatus for mechanically reducing the cross section of a ceramic superconductor using a rectangular shaped channel and complementary shaped roll.

It is a further object of the invention to provide a novel apparatus for mechanically reducing a ceramic superconductor using a shaped, recessed channel and a shaped roll having a confined width to control the mechanical reduction operation.

It is still a further object of the invention to provide a novel article of manufacture of highly textured ceramic superconductor wire or tape.

These and other objects, features and advantages of the present invention will be readily apparent from the following description of the preferred embodiments thereof, taken in conjunction with the accompanying drawings described below wherein like elements have like numerals throughout the several views.

DETAILED DESCRIPTION OF PREFERRED EMBODIMENTS

Figure 1:
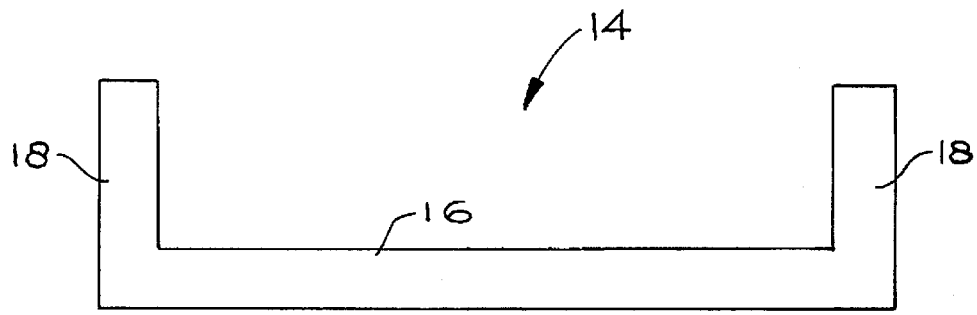
FIG. 1 is a cross-sectional end view of a channel portion of a rolling system constructed in accordance with the invention.
Figure 2:
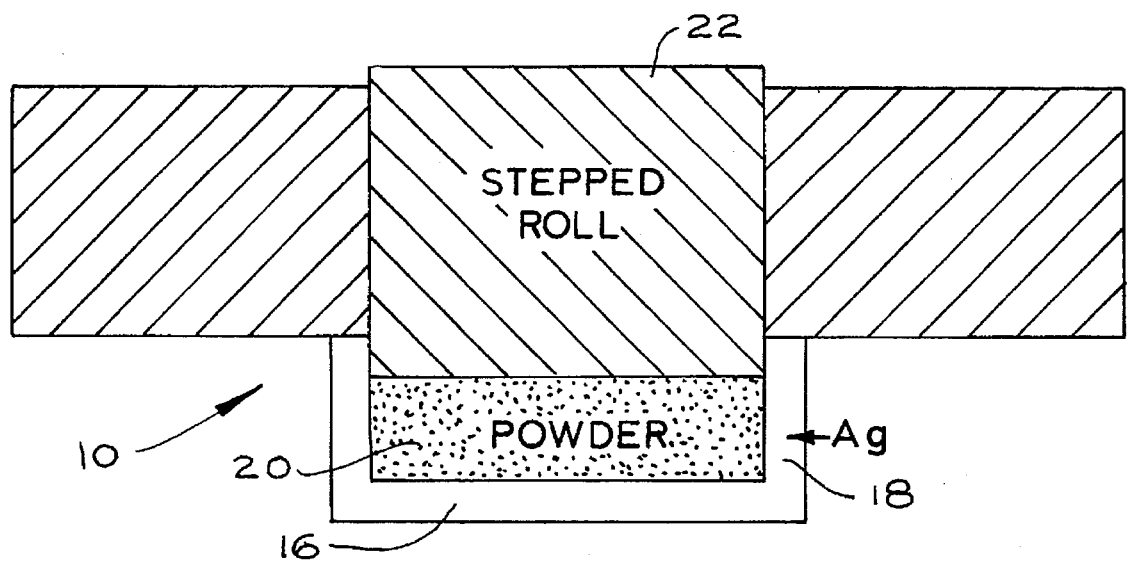
FIG. 2 is a view of the channel portion of FIG. 1 showing a superconductor powder being compacted by a stepped roll to obtain a desired texture.
Figure 3:
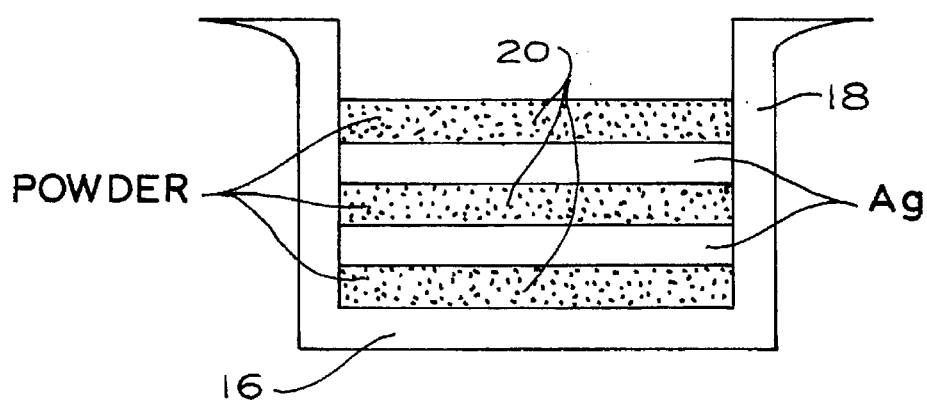
FIG. 3 is a view of the channel portion of FIG. 1 with multilayer packing of silver metal and superconductor powder to make a multifilamentary tape.
Figure 4:
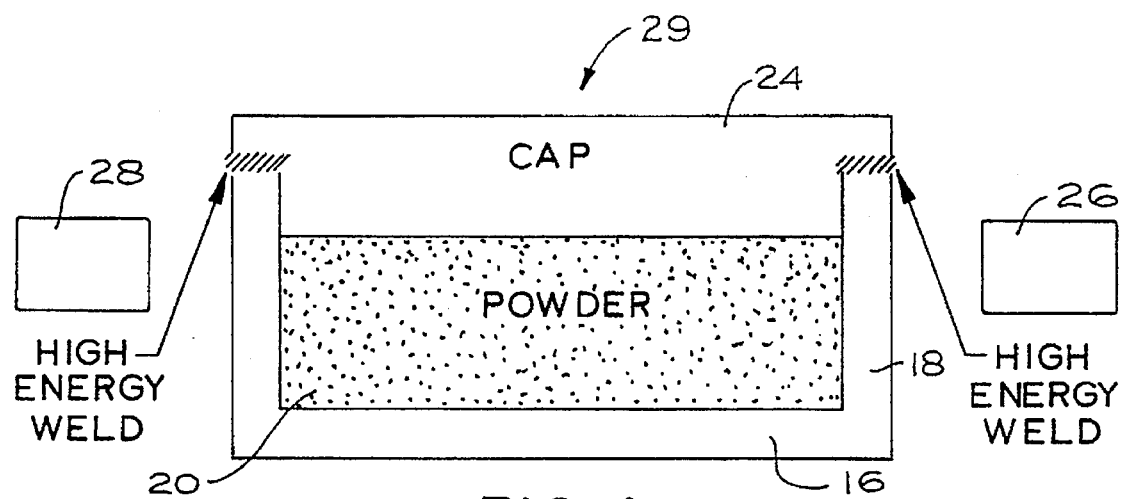
FIG. 4 is a cross-sectional end view of a rolling apparatus channel portion containing superconductor powder with a cap portion welded to the channel.

A method and an apparatus characteristic of the invention can be understood by reference to the figures and particularly to FIGS. 1–5. In order to perform the method of the invention, a rolling apparatus 10 (see FIG. 2) is first used to form a compacted ceramic superconductor powder in preparation for rolling to a superconductor wire or tape product 12 shown in FIG. 6. The rolling apparatus 10 includes a channel portion 14 with a flat bottom 16 and substantially perpendicular side walls 18 (see FIG. 1). Such a geometry can be accomplished by forming a ductile metal stock material into the desire shape. The channel portion 14 should have sufficient depth and wall thicknesses to sustain several reduction steps before achieving the final dimensions. The ductile metal stock can be any one of a variety of elemental metals and/or metal alloys, provided the metal does not chemically react to detrimentally affect the desired superconducting properties. A most preferred metal is silver which is easily formed into the channel portion 14 and does not react with ceramic superconductors to affect superconductor electrical properties. The ductile metal stock preferably also has high electrical conductivity, formability and high oxygen solubility, as does silver. The high electrical conductivity property makes the channel portion 14 a better conductor around any potential gaps which might form in the superconducting path of the finished superconductor product 12. High solubility for oxygen allows the oxygen content of the ceramic superconductor to be changed in a known manner by elevated temperature heat treatments, preferably performed after fabrication of the superconductor product 12.

Figure 7:
FIG. 7 is a scanning electron microscope (SEM) micrograph of a superconducting ceramic before being packed into the channel portion of FIG. 1.
Figure 8:
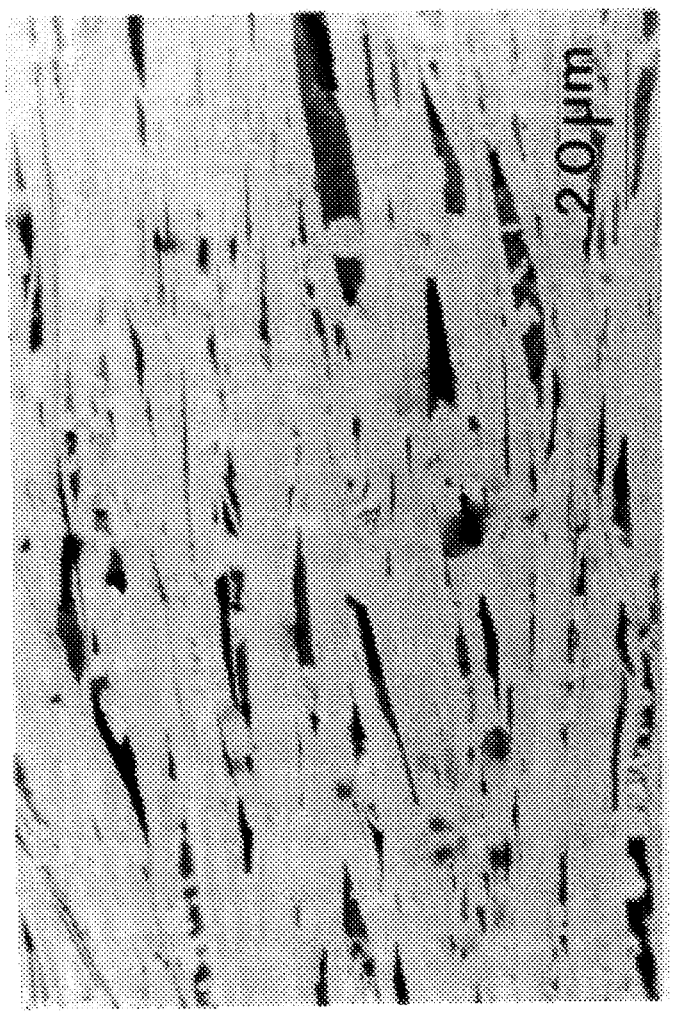
FIG. 8 is an SEM micrograph of a superconducting ceramic after being packed into the channel portion of FIG. 1 using the method illustrated in FIG. 2 and then heat treated.

In the next step of the process invention a ceramic superconductor powder 20 (see FIG. 2) is packed into the channel portion 14 using the rolling apparatus 10. The ceramic superconductor powder 20 preferably takes the form of plate-like particles with superconducting properties preferentially oriented relative to the plate-like shape. For example, a superconductive plane can be oriented parallel to the plate-like shape, or perpendicular to the thickness dimension of the plate-like particle. The plate-like shape therefore can be used to establish a preferential crystallographic texture for the ceramic superconductor powder 20. This texture ultimately permits formation of the macroscopic superconductor product 12 having superconducting properties with optimized property values along the current carrying direction. In order to help establish this preferential texture for the powder 20, a stepped roll 22 is used to compress the powder 20 (see in FIGS. 7 and 8 the appearance of the powder 20 before and after compaction, respectively). This stepped roll 22 in the rolling apparatus 10 causes compression which results in the superconducting planes of the powder 20 being oriented substantially along the axis of the channel portion 14. This initial rolling process also provides an initial densification of the powder 20, as well as establishes the appropriate level and thickness of the powder 20 in the channel portion 14.

In a next step of the method the channel portion 14 is fitted with a cap portion 24 (see FIG. 4) preferably constructed of the same metal as the channel portion 14. The cap portion 24 is tightly fitted onto the open top of the channel portion 14 above the powder 20. The channel portion 14 is then welded to the cap portion 24, preferably by using a high energy source, such as, for example, an electron beam source 28, a TIG source and most preferably a laser 26. A completed bar 29 is then ready for rolling mill reduction. While other conventional means can be used to join the cap portion 24 to the channel portion 14, such as mechanically rolling of the seams, a high energy input process is preferred. Such a process prevents heat from the welding process from being conducted through the silver (or other appropriate metal stock) and causing melting of the superconducting ceramic particles. Such a melting event can result in formation of nonsuperconducting phases and/or misorientation of the superconducting planes relative to the preferred texture described hereinbefore.

Figure 5:
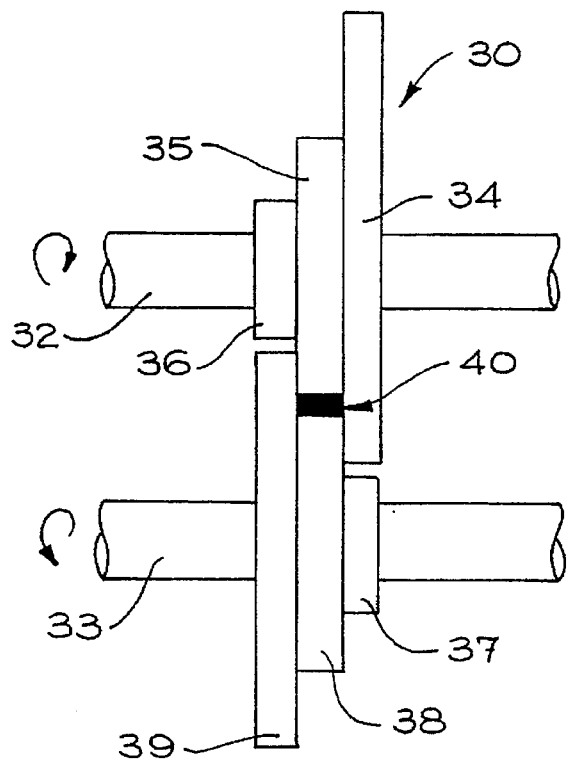
FIG. 5 illustrates a series of rolls for mechanical reduction of the welded channel portion of FIG. 4.

After completing the welding of the cap portion 24 to the channel portion 14, the channel portion 14 of the bar 29 is reduced in thickness and increased in length by passage through use of a bar rolling apparatus 30 (see FIG. 5). The rolling apparatus 30 preferably includes shafts 32 and 33 rotating in opposite directions, and each of the shafts 32 and 33 include integrally coupled roll disks 34–39 The roll disks 34 and 38 define a controllable open space 40 through which the bar 29 passes and is rolled to a tape or wire of smaller dimension. The roll disks 34, 36, 37 and 39 act to restrain the bar 29 from sideways deformation forcing lengthwise deformation and forming the elongated type product 12. This arrangement of the roll disks ensure that the rolling energy goes into lengthening, not widening, the dimension of the contained superconductor powder 20 which is undergoing mechanical reduction.

During the rolling operation, the bar 29 is periodically annealed at a temperature high enough to permit recrystallization of the silver (or other metal stock), but low enough to avoid any substantial sintering of the enclosed superconducting ceramic. Such annealing acts to remove excessive cold work buildup, enabling the continued reduction of the cross section of the contained powder 20 being mechanically fabricated. When the thickness of the bar 29 has been sufficiently reduced to be within several reduction cycles of the final intended tape or wire cross section, the bar 29 is preferably subjected to a sintering heat treatment to densify the superconducting powder 20. Preferably, after completion of the sintering operation and mechanical reduction to the final size, the product is annealed in an oxidizing atmosphere to optimize the electrical properties.

The entire process is continuous to the extent a continuous arbitrary length of the bar 29 can be fed into the bar rolling apparatus 30 for continuous reduction to the final cross section desired. In assembly of the bar 29 the channel portion 14 can also be continuously filled with superconductor powder 20, the cap portion 24 continuously welded to the channel portion 14 and the previously described rolling operation carried out.

In other forms of the invention, the channel portion 14 of the bar 29 can have a trapezoidal, hexagonal or other polygonal cross section susceptible to rolling using a complementary shaped roll and channel opening. Thus, the final product can be virtually any final cross sectional shape, such as octagonal, and can be obtained by controlling the geometry of the bar rolling apparatus 30. Generally, the final product, such as the sintered wire form of the superconductor product 12 shown in FIG. 6, preferably has the same cross section as the shape of the superconductor powder 20 within the channel portion 14 of the bar 29. Maintaining the same type of cross section for the end superconductor product 12 as the starting channel shape assists in minimizing excessive mechanical stresses which can accumulate during the reduction process. Accumulation of too much stress can cause cracking or formation of other undesirable mechanical defects.

Figure 6:
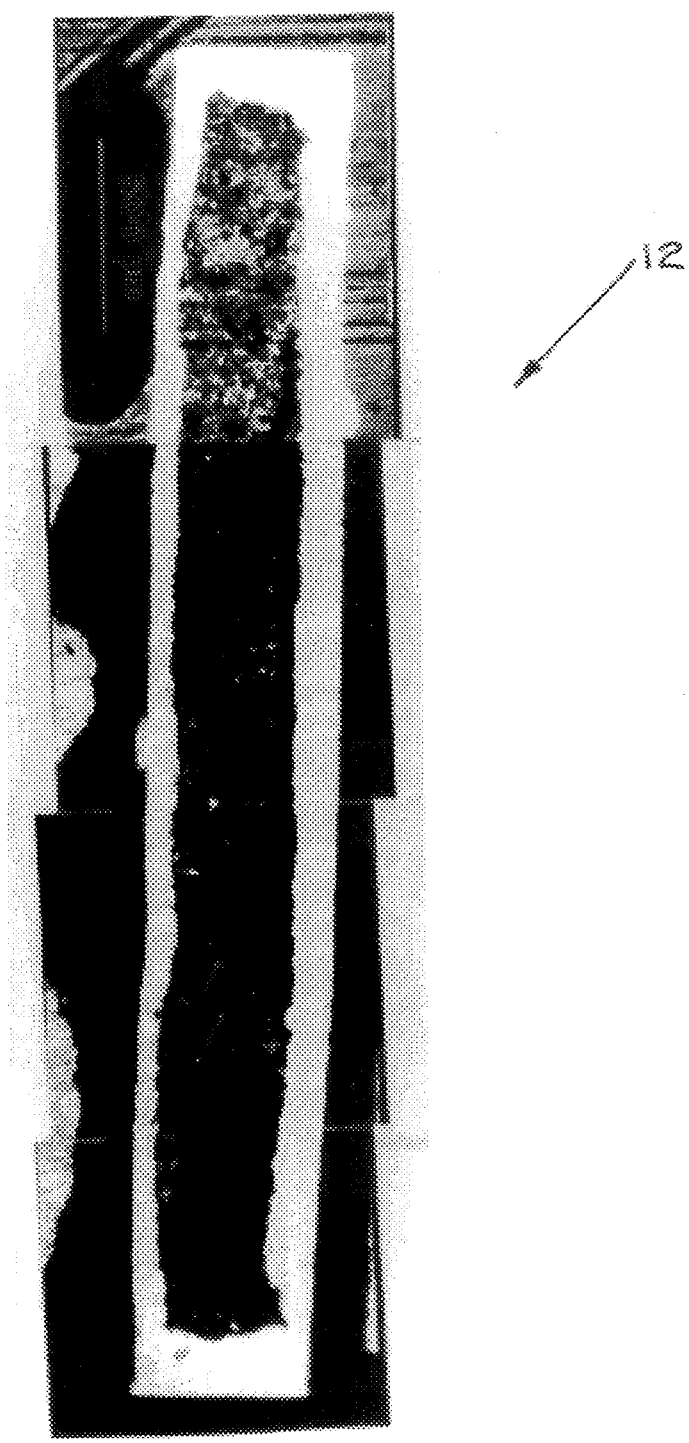
FIG. 6 is a micrograph showing a transverse cross-section of a superconductor product.
Figure 9:
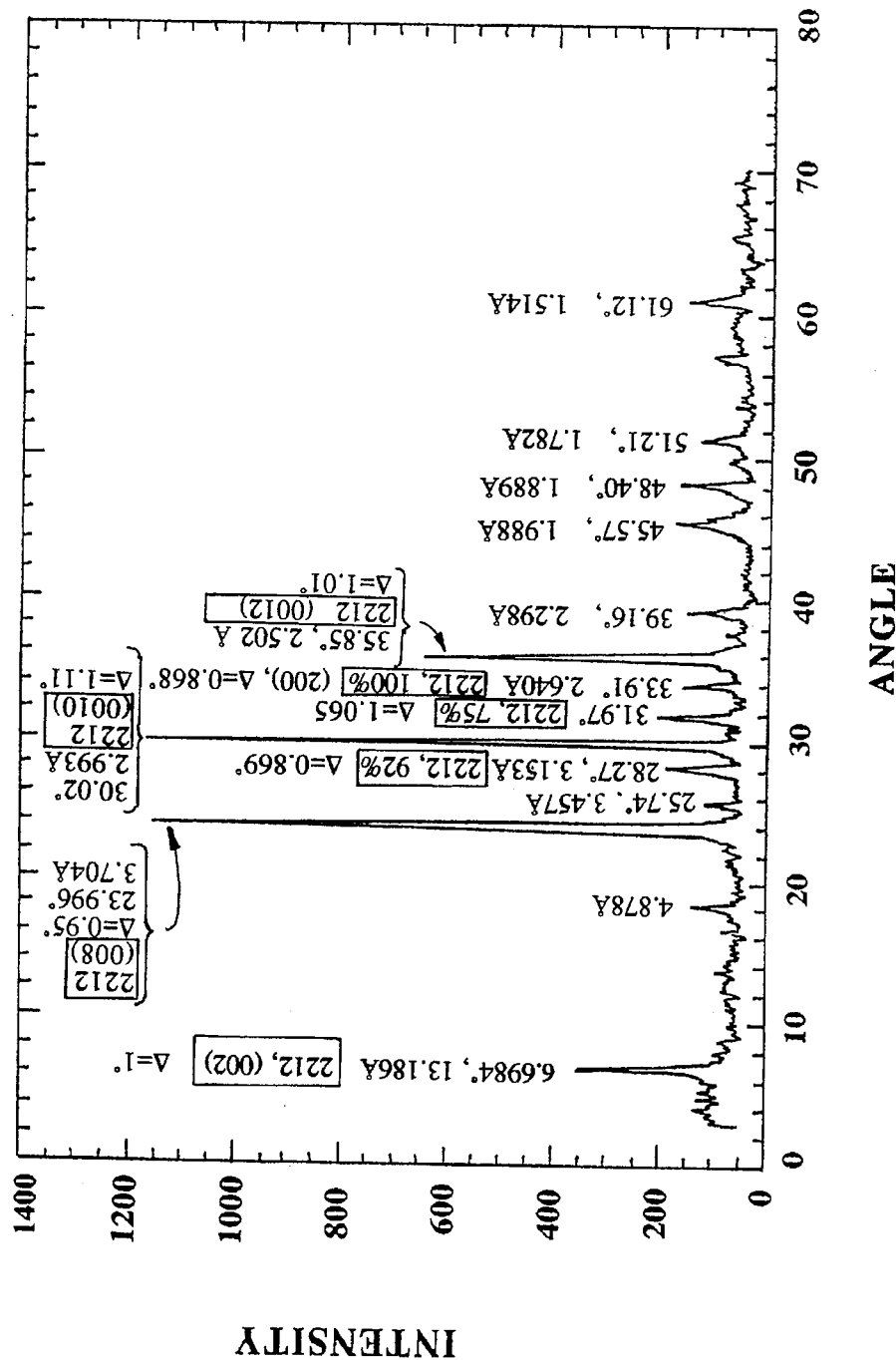
FIG. 9 is an X-ray diffraction pattern from an end product superconducting ceramic showing enhancement of crystallographic texture formation associated with c-axis alignment perpendicular to the wire width.

The use of the above described polygonal shapes for the channel portion 14 advantageously results in the final product (the superconductor product 12) containing a higher fraction of superconducting material than achieved by any conventional process (see, for example FIG. 6 and Example I). Such an improvement enhances electrical performance and reduces manufacturing costs. Further, by establishing a preferred texture for the superconductor powder 20 before welding the cap portion 24 to the channel portion 14 (see FIGS. 8 and 9), the resulting sintered wire form of the superconductor product 12 exhibits an improved texture giving rise to substantially improved superconductor properties.

A further advantage of the invention is processing the ceramic superconductor during the steps when the channel portion 14 has a top open (the cap portion 24 is not in position). This mode of processing gives rise to the ability to intervene easily during the processing sequence. Conventional techniques use a metal overlayer which interferes with any intervention steps. For example, in Tl—Ba—Ca—Cu—O superconductors, the best current carrying capacity is achieved by reacting a Tl containing vapor with a layer of Ba—Ca—Cu—O. While conventional sealed tube processing methods would not permit this type of vapor processing, the instant invention allows such processing before sealing the cap portion 24 to the channel portion 14.

The following nonlimiting examples illustrate several particular methods of manufacturing superconductor wire in accordance with invention.

EXAMPLE I

In a most preferred embodiment the ceramic superconductor product is made by the following procedure:

1. Form the channel portion using stepped rolls: Ag 0.010" thick, 0.040" tall, 0.125" wide.
2. Form the cap portion using shaped rolls: 0.010" thick with 0.005" edges.

3. Pack the channel portion with BiSCC0 2212 powder. Packing procedure involves:
   a. Pack powder into channel portion and press with spatula;
   b. Roll into place with stepped rolling apparatus;
   c. Check depth with comparator;
   d. Load powder again;
   e. Roll with stepped rolling apparatus;
   f. Check depth with comparator;
   g. Load powder again;
   h. Roll with stepped rolling apparatus;
   i. Three such operations were sufficient to pack the channel portion to a depth of 0.025".
4. Weld cap portion to channel portion using conventional laser welding methods.
5. Rolling schedule:
   a. Anneal welded part at 600° F. for 10 minutes.
   b. Reduce using stepped rolls to a projected value of about 5% reduction per pass and annealing after 20% reduction:
      Pass 1 to 0.037";
      Pass 2 to 0.036"; width 0.1245";
      Pass 3 to 0.034";
      Pass 4 to 0.032"; width 0.0124";
   c. Anneal at 600° F. for 7 minutes:
      Pass 5 to 0.029";
      Pass 6 to 0.027"; width 0.1243";
      Pass 7 to 0.025";
      Pass 8 to 0.024" and a 1.5" section was archived.
   d. Anneal at 600° F. for 7 minutes:
      Pass 9 to 0.020";
      Pass 10 to 0.0195";
      Pass 11 to 0.0175";
      Pass 12 to 0.017" and a 2" section was archived.
   e. Anneal to 600° F. for 7 minutes:
      Pass 13 to 0.015";
      Pass 14 to 0.0135";
      Pass 15 to 0.0125" and a 2" section was archived.
   f. Anneal at 600° F. for 7 minutes:
      Pass 16 to 0.011";
      Pass 17 to 0.0095";
      Pass 18 to 0.0085".
6. Heat Treatment Schedule in ambient:
   a. Heat from room temperature to 830° C. at 2° C. per minute;
   b. Heat from 830° C. to 885° C. at 1° C. per minute;
   c. Hold at 885° C. for 30 minutes;
   d. Cool from 885° C. to 862° C. at 0.167° C. per minute;
   e. Hold at 862° C. for 180 minutes;
   f. Cool to room temperature at 2° C. per minute.
7. Final rolling of the product with approximately 25% reduction was taken for a range of wire thicknesses from 0.024" to 0.085", and the most preferred size was a 0.011" wire rolled to 0.008";
8. Final heat treatment:
   a. Heat to 840° C. at 3° C. per minute;
   b. Hold at 840° C. for 100 hours;
   c. Cool to room temperature at 1° C. per minute.
9. Test at 4.2K. The ceramic superconductor wire product with a thickness of 0.008" had the best measurable critical current density of 9770 amps/cm$^2$.

While preferred embodiments of the invention have been shown and described, it will be clear to those skilled in the art that various changes and modifications can be made without departing from the invention in its broader aspects as set forth in the claims provided hereinafter.

What is claimed is:

1. A system for mechanically forming a ceramic superconductor product, comprising:

a metallic channel portion having a cross section for receiving a ceramic superconductor powder;

roll means for mechanically compacting said ceramic superconductor powder within said channel portion, said roll means having a complementary cross section matingly receivable by said channel portion cross section;

a cap portion welded to said metallic channel portion with a high energy, localized weldment of said cap portion to said channel portion; and a bar rolling apparatus for shaping said channel portion, cap portion and powder, while said powder is with said channel portion and said cap portion is welded to said channel portion.

2. The system as defined in claim 1 wherein said metallic channel portion comprises a silver containing metal.

3. The system as defined in claim 1 wherein said cross section comprises a polygonal cross section.

4. The system as defined in claim 3 wherein said polygonal cross section comprises a parallelogram.

5. The system as defined in claim 4 wherein said parallelogram is rectangular.

6. The system as defined in claim 3 wherein said polygonal cross section comprises a flat bottom with perpendicular side walls.

7. The system as defined in claim 1 wherein said channel portion and cap portion comprise continuous lengths which permit continuous manufacture of said ceramic superconductor product.

8. A system for mechanically forming a ceramic superconductor product, comprising:

a continuous metallic channel portion having a cross section for receiving a ceramic superconductor powder, said metallic channel portion holding a layer of silver metal adjacent a layer of said ceramic superconductor powder;

means for mechanically compacting said ceramic superconductor powder, said means for compacting further having a complementary cross section matingly receivable by said channel portion cross section; and a cap portion having a high energy, localized weldment coupling said metallic channel portion to said cap portion.

9. The system as defined in claim 8 wherein said metallic channel portion comprises a silver containing metal.

10. The system as defined in claim 8 wherein said cross section comprises a polygonal cross section.

11. The system as defined in claim 10 wherein said polygonal cross section comprises a parallelogram.

12. The system as defined in claim 11 wherein said parallelogram is rectangular.

13. The system as defined in claim 10 wherein said polygonal cross section comprises a flat bottom with perpendicular side walls.

* * * * *

UNITES STATES PATENT AND TRADEMARK OFFICE
CERTIFICATE OF CORRECTION

PATENT NO.      : 5,661,113

DATED           : August 26, 1997

INVENTOR(S)     : Steven Danyluk, et al.

It is certified that error appears in the above-identified patent and that said Letters Patent is hereby corrected as shown below:

In Column 1, line 57, delete "generaling" and insert --generating--.
In Column 2, line 52, delete "desire" and insert --desired--.
In Column 3, line 52, insert a period --.-- after "34-39".
In Column 6, line 20, delete "with" and insert --within --.

Signed and Sealed this

Fourteenth Day of July, 1998

*Attest:*

BRUCE LEHMAN

*Attesting Officer*            *Commissioner of Patents and Trademarks*